United States Patent
Zhang et al.

(10) Patent No.: US 11,705,694 B1
(45) Date of Patent: Jul. 18, 2023

(54) SYSTEMS AND METHODS FOR OPTICAL INJECTION-LOCKING IN AN ACCESS NETWORK

(71) Applicant: CABLE TELEVISION LABORATORIES, INC., Louisville, CO (US)

(72) Inventors: Haipeng Zhang, Broomfield, CO (US); Zhensheng Jia, Superior, CO (US); Luis Alberto Campos, Superior, CO (US); Mu Xu, Broomfield, CO (US); Junwen Zhang, Broomfield, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 183 days.

(21) Appl. No.: 17/187,237

(22) Filed: Feb. 26, 2021

Related U.S. Application Data

(60) Provisional application No. 62/981,864, filed on Feb. 26, 2020.

(51) Int. Cl.
| | | |
|---|---|---|
| *H01S 3/16* | (2006.01) | |
| *H01S 5/40* | (2006.01) | |
| *H01S 5/14* | (2006.01) | |
| *H01S 5/065* | (2006.01) | |
| *H01S 5/00* | (2006.01) | |
| *H01S 5/028* | (2006.01) | |
| *H04B 10/50* | (2013.01) | |

(52) U.S. Cl.
CPC ............ *H01S 5/4006* (2013.01); *H01S 5/005* (2013.01); *H01S 5/0288* (2013.01); *H01S 5/0656* (2013.01); *H01S 5/14* (2013.01); *H01S 5/141* (2013.01); *H04B 10/503* (2013.01)

(58) Field of Classification Search
CPC ...... H01S 5/4006; H01S 5/005; H01S 5/0288; H01S 5/0656; H01S 5/14; H01S 5/141
See application file for complete search history.

(56) References Cited

U.S. PATENT DOCUMENTS

| | | | | |
|---|---|---|---|---|
| 2004/0101317 | A1* | 5/2004 | Yap | H01S 5/4006 |
| | | | | 398/187 |
| 2005/0013337 | A1* | 1/2005 | Jung | H01S 5/4006 |
| | | | | 372/50.1 |
| 2010/0289408 | A1* | 11/2010 | Madey | H04B 10/70 |
| | | | | 250/493.1 |
| 2014/0161148 | A1* | 6/2014 | Osinki | H01S 5/4006 |
| | | | | 372/50.1 |
| 2014/0205293 | A1* | 7/2014 | Lin | H01S 5/5036 |
| | | | | 398/58 |

(Continued)

*Primary Examiner* — Kinam Park
(74) *Attorney, Agent, or Firm* — Josh C. Snider

(57) ABSTRACT

An injection locking laser source is provided for an optical communications system. The injection locking laser source includes a laser cavity configured to receive an externally injected low linewidth primary light source. The laser cavity includes a cavity length, a cavity facet reflectivity, and a cavity quality factor. The injection locking laser source further includes an emitting region configured to output a secondary light source injection locked to the externally injected low linewidth primary light source at a stable detuning frequency based on a photon number, a steady-state phase, and a carrier number of the primary light source injected into the cavity.

20 Claims, 13 Drawing Sheets

(56) References Cited

U.S. PATENT DOCUMENTS

| | | | |
|---|---|---|---|
| 2015/0030324 A1* | 1/2015 | Chang | H04B 10/516 |
| | | | 398/35 |
| 2017/0294966 A1* | 10/2017 | Jia | H04J 14/04 |
| 2020/0119813 A1* | 4/2020 | Zhang | H04J 14/04 |

* cited by examiner

US 11,705,694 B1

SYSTEMS AND METHODS FOR OPTICAL INJECTION-LOCKING IN AN ACCESS NETWORK

CROSS REFERENCE TO RELATED APPLICATIONS

This application claims the benefit of and priority to U.S. Provisional Patent Application Ser. No. 62/981,864, filed Feb. 26, 2020, which is incorporated herein by reference in its entirety.

BACKGROUND

The field of the disclosure relates generally to fiber communication networks, and more particularly, to coherent optical networks utilizing injection locking.

Telecommunications networks include an access network through which end user subscribers connect to a service provider. Bandwidth requirements for delivering high-speed data and video services through the access network are rapidly increasing to meet growing consumer demands. As the present-day world relies heavily on fast and reliable exchange of information, the ever increasing demand for higher data rates continues to exceed the installed system capacity of conventional networks. There is an expressed need in the field of conventional network operators states that next generation optical access networks will require high symmetrical sustained date rates per user, long reach (e.g., 60-100 km), and a high splitting ratio of up to 1000.

Conventional networks have recently been based on Passive Optical Network (PON) access technologies as a dominant architecture to meet the increasing high capacity demand. As such PON technologies evolve toward 100 Gb/s and higher data rates, coherent optical access technology has been shown to be a promising solution to fulfill the recognized data rate, reach, and splitting ratio requirements. Coherent technology has for some time been successfully implemented in long-haul backbone networks. Accordingly, there is a desire in the field to extend the utilization of coherent technology to the access network. Coherent technologies, for example, yield significant advantages over conventional direct detection systems and PONs, in terms of a superior receiver sensitivity, a higher spectral efficiency, and more flexible channel selectivity.

The implementation of long-haul coherent optical technologies for the access network environment though, has presented significant challenges. Long-haul coherent technology architectures are considered "over-engineered" with respect to the access network paradigm, and are also considered prohibitively expensive, due to their use of advanced narrow-linewidth laser sources and high-performance digital signal processing (DSP) systems and components.

One solution to these cost challenges implements Coherent Optical Injection Locking (COIL) to reduce the significant cost that would be required by the wide deployment of expensive laser sources throughout the many end users in the access network. The overall system cost of the access network, for example, is dominated by optical and optic-electronic components such as low-linewidth tunable laser sources for the multiple transceivers in the network. Innovative COIL architectures and processes that overcome such cost challenges, are described in greater in U.S. Pat. No. 9,912,409, and also in U.S. patent application Ser. No. 16/453,836, filed Jun. 26, 2019, both of which are incorporated by reference herein in their entireties. As described therein, COIL offers a significantly lower-cost alternative to the wide deployment of the significantly more expensive External Cavity Lasers (ECLs) for a variety of access network scenarios.

COIL operates on the principle that a secondary semiconductor laser (e.g., a downstream laser source) may be locked to frequency and phase of an externally-injected primary optical source (e.g., an upstream laser source). Through this COIL technique, the secondary laser source, which may be of considerably lower-cost and lower-quality laser (e.g., a Fabry-Perot laser diode (FPLD)) than the primary optical source (e.g., an external cavity laser (ECL)), may be effectively turned into a high-performance narrow linewidth laser by injecting light from the high quality primary optical source into the cavity of the lower quality secondary laser. This COIL principle is sometimes referred to as "laser cloning." A conventional COIL architecture is described further below with respect to FIG. 1.

FIG. 1 is a schematic illustration of a conventional COIL architecture 100. As depicted in FIG. 1, architecture 100 includes an optical line terminal (OLT) 102 and an optical network unit (ONU) 104 disposed downstream OLT 102. OLT 102 includes a primary laser source 106, such as an ECL, serving as the high-quality seed (sometimes referred to as the "parent" or "master") source transmitting to an injection-locked secondary (sometimes referred to as the "child" or "slave") laser 108, such as an FP, included in ONU 104. In this conventional configuration, ONU 104 further includes an optical circulator 110 and a polarization beam splitter 112 disposed in front of optical circulator 110 with respect to OLT 102. Thus, the essentially lower-quality/lower-cost secondary laser 108 is thereby effectively enabled to operate as a much higher-performing light source in the coherent transmission system of architecture 100, namely, by injection-locking secondary laser 108 (i.e., through optical circulator 110) with higher-quality laser 106 such that injection-locked secondary laser 108 behaves comparably to primary laser 106. In this configuration, architecture 100 further includes an I-Q modulator 114 to generate an upstream signal from the single-mode laser output of secondary laser 108.

Nevertheless, although this conventional COIL architecture provides a high quality coherent light source at a significantly reduced material cost, an external modulator (not shown in FIG. 1) is often required for the generation of high-speed data, which adds additional cost to the system. In some instances, however, because COIL implementation may also improve the modulation bandwidth and frequency response of the secondary lasers, direct modulation of the COIL secondary lasers is considered to further reduce the material cost of the system. Accordingly, there is a need for improved COIL systems and methods utilizing more inexpensive direct modulation techniques.

BRIEF SUMMARY

In an embodiment, an injection locking laser source is provided for an optical communications system. The injection locking laser source includes a laser cavity configured to receive an externally injected low linewidth primary light source. The laser cavity includes a cavity length, a cavity facet reflectivity, and a cavity quality factor. The injection locking laser source further includes an emitting region configured to output a secondary light source injection locked to the externally injected low linewidth primary light source at a stable detuning frequency based on a photon number, a steady-state phase, and a carrier number of the primary light source injected into the cavity.

BRIEF DESCRIPTION

These and other features, aspects, and advantages of the present disclosure will become better understood when the following detailed description is read with reference to the accompanying drawings in which like characters represent like parts throughout the drawings, wherein.

Figure 6A:
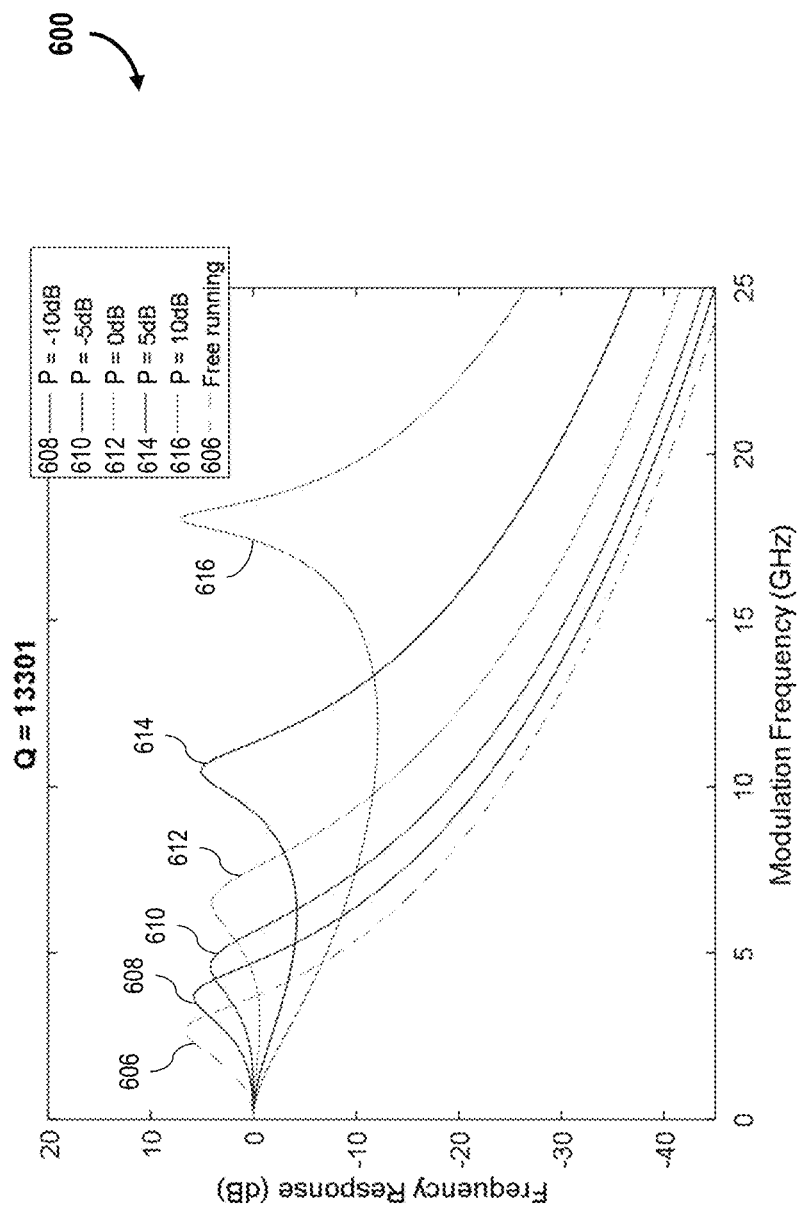
Figure 6B:
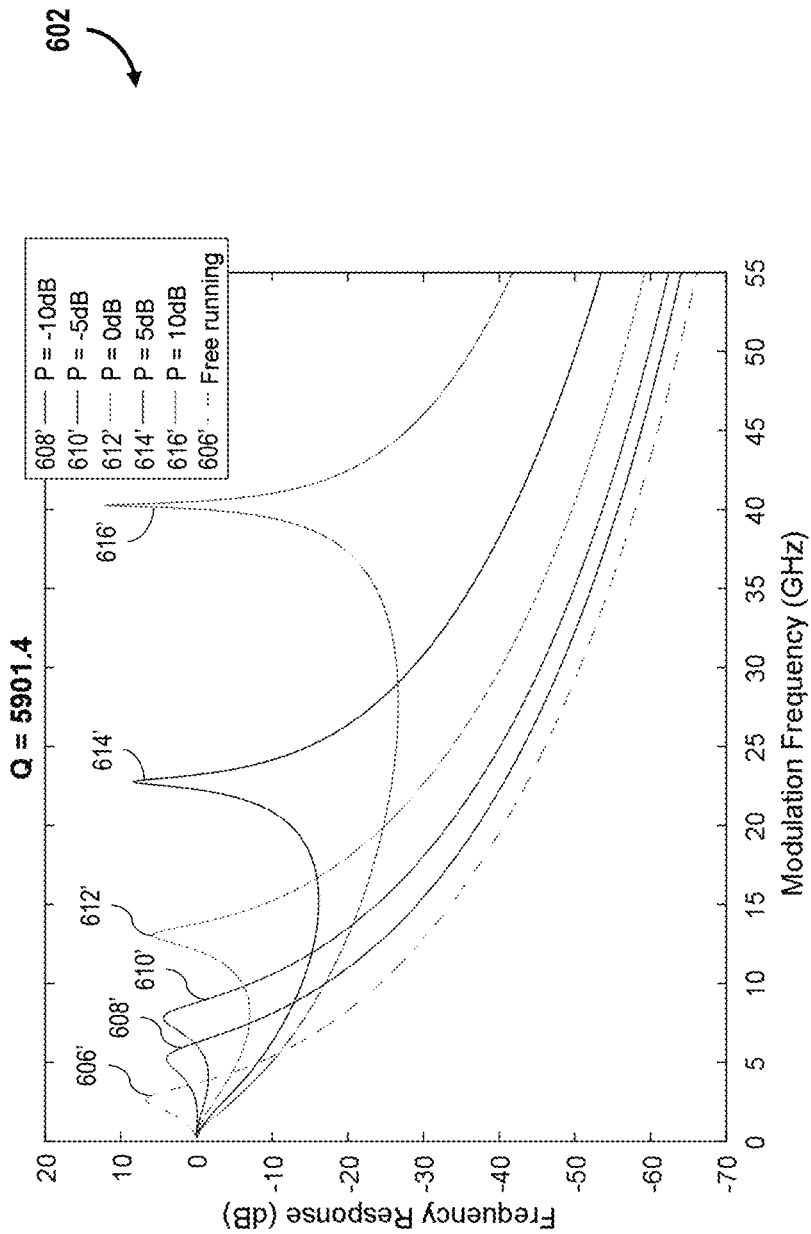
Figure 6C:
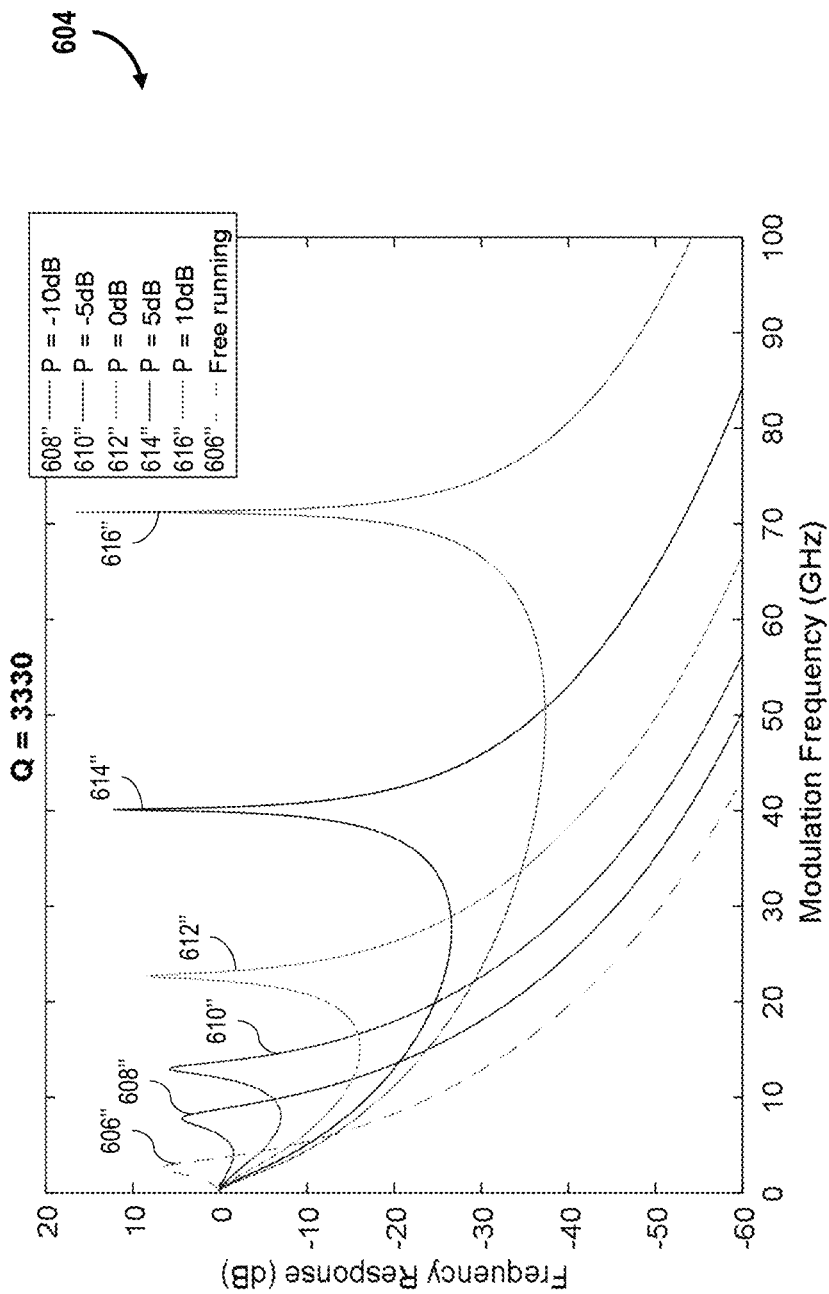

FIGS. 6A-C are graphical illustrations depicting comparative frequency response plots under different cavity quality factors, in accordance with an embodiment.

Figure 7:
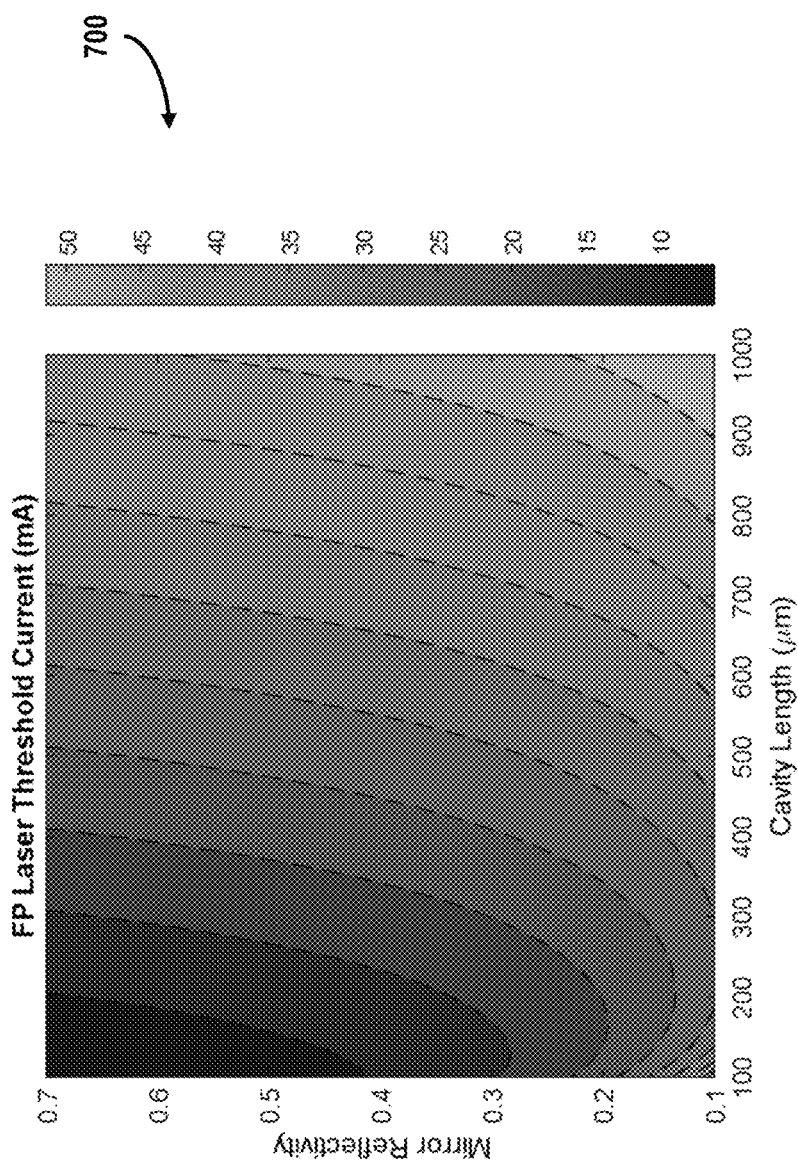

FIG. 7 is a graphical illustration depicting a plot of a COIL secondary laser threshold current as a function of mirror reflectivity and cavity length, in accordance with an embodiment.

Figure 8B:
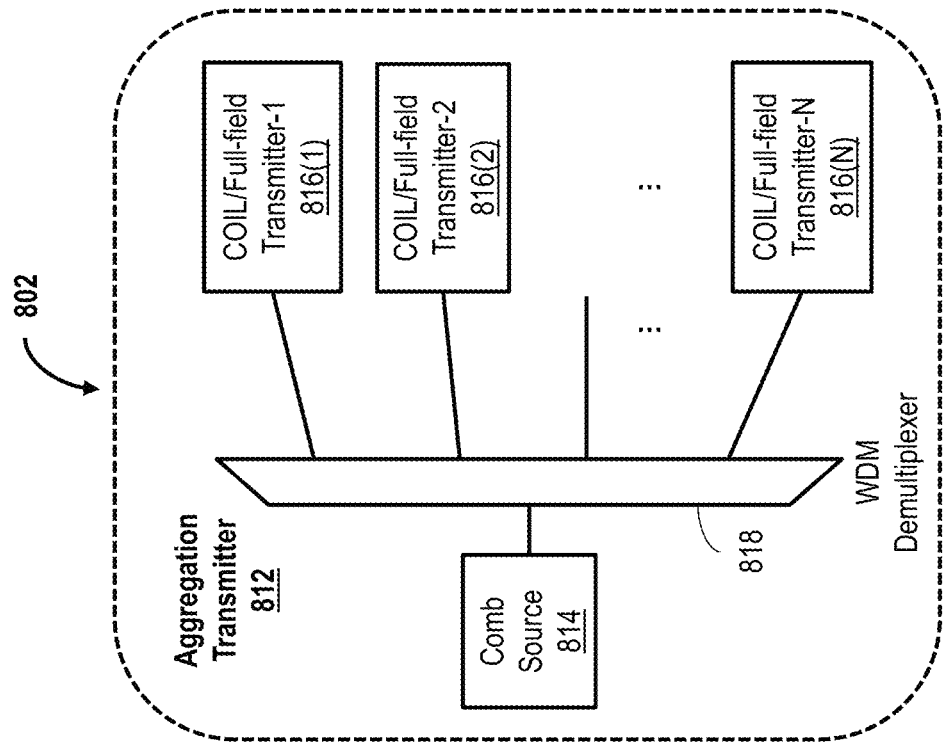
Figure 8A:
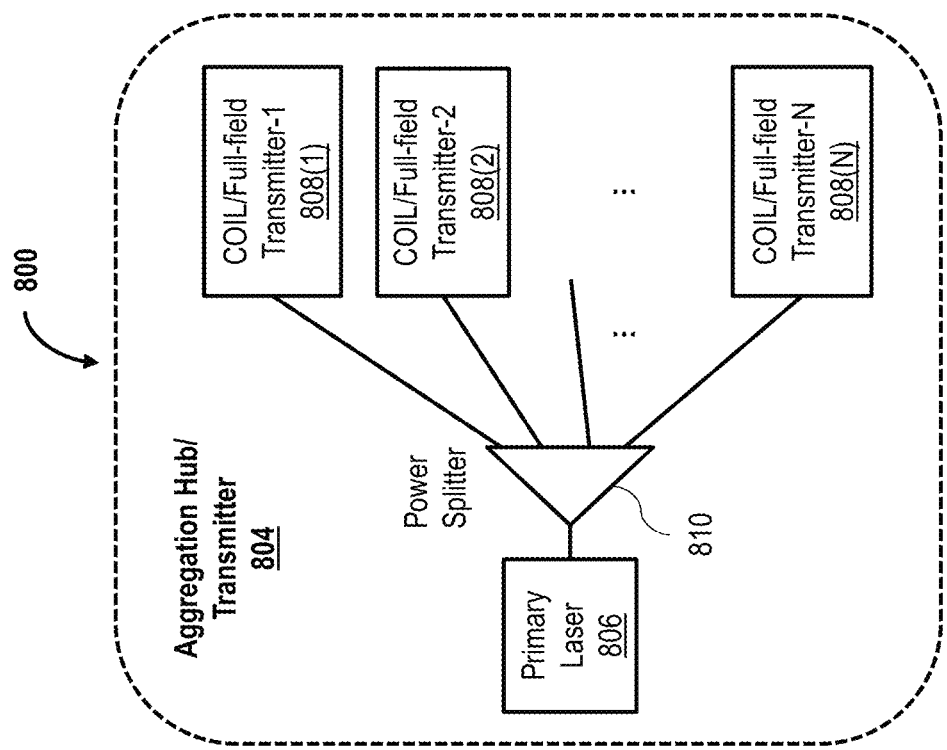

FIGS. 8A-B are schematic illustrations of single-source point-to-multipoint architectures, in accordance with the embodiments herein.

Figure 9:
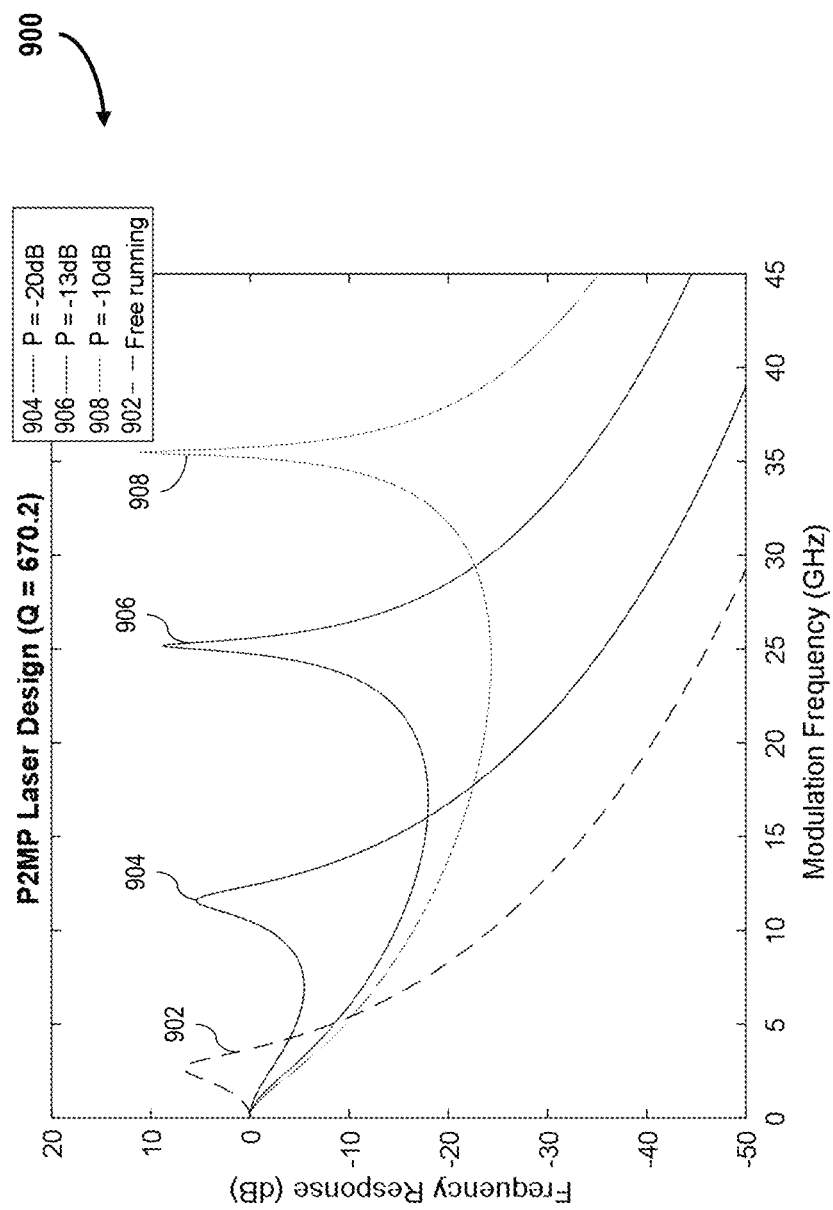

FIG. 9 is a graphical illustration depicting a comparative frequency response plot of a short-cavity secondary laser in accordance with the point-to-multipoint architecture depicted in FIG. 8A.

Figure 10B:
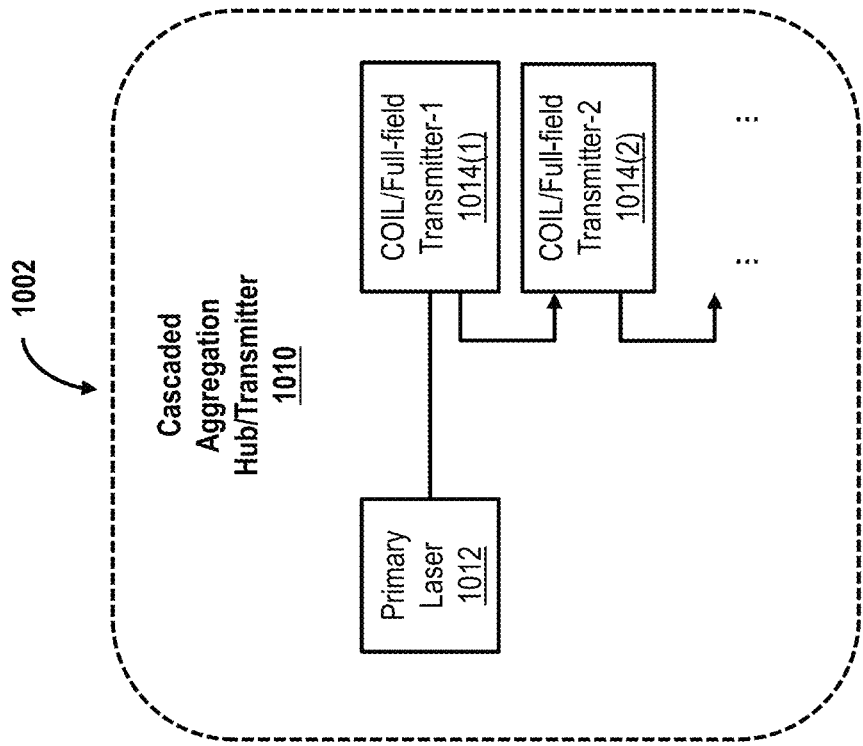
Figure 10A:
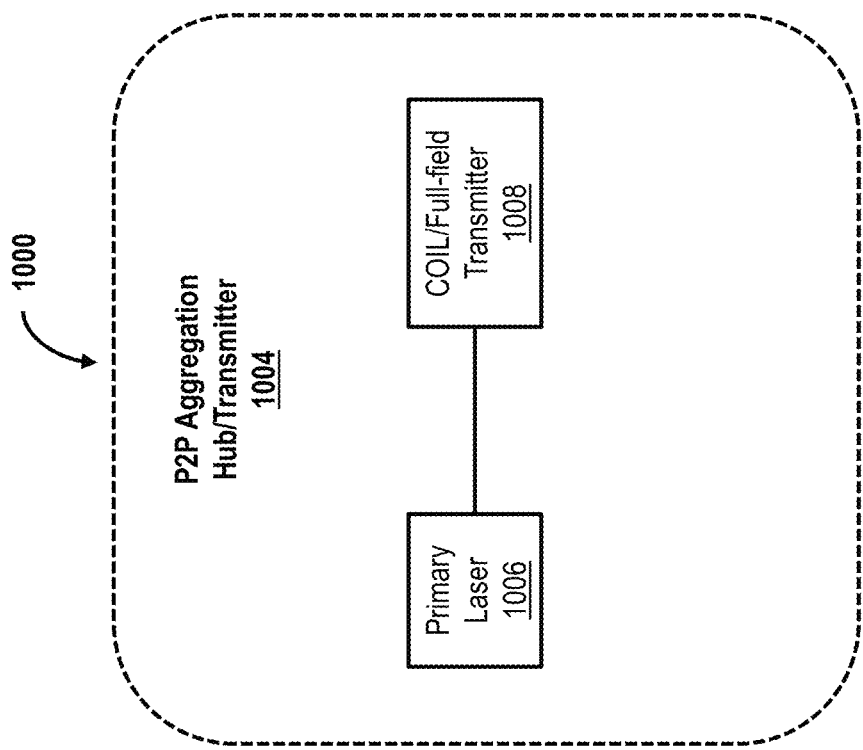

FIGS. 10A-B are schematic illustrations of single-source point-to-point architectures, in accordance with the embodiments herein.

Figure 11:
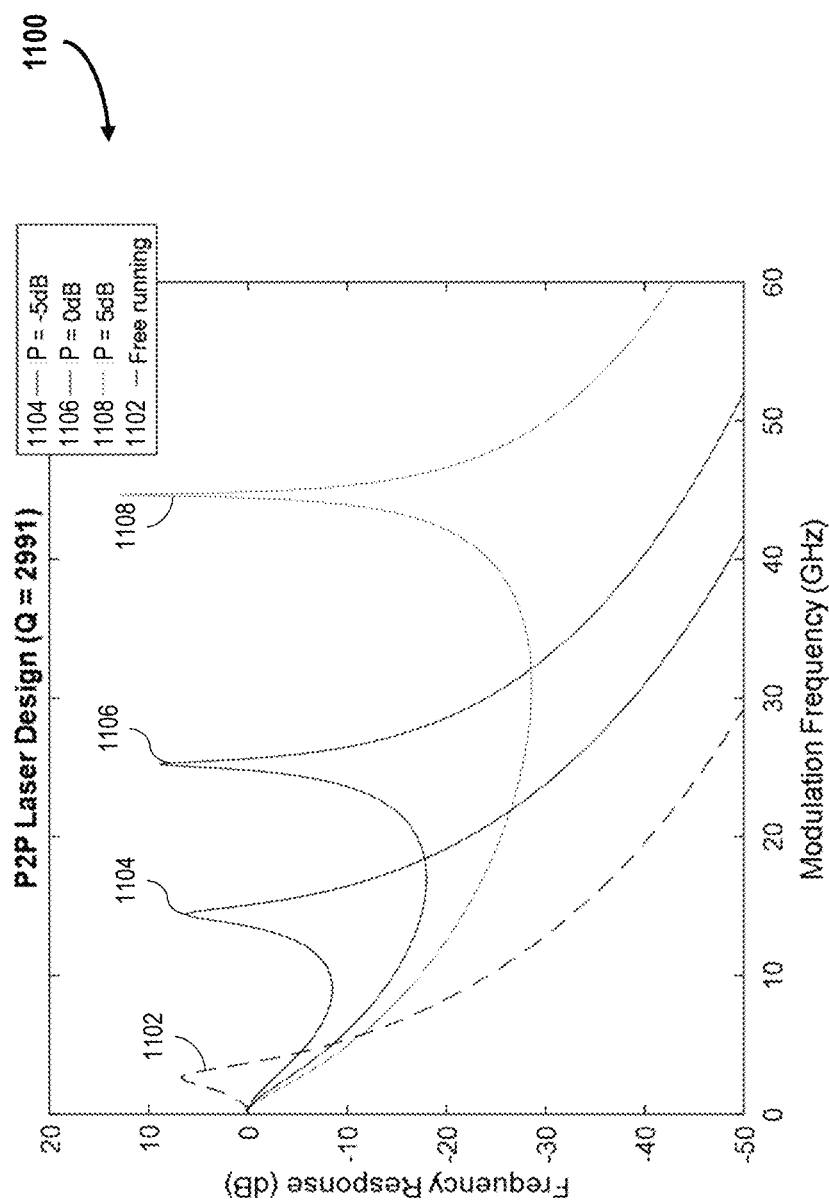

FIG. 11 is a graphical illustration depicting a comparative frequency response plot of a low-threshold secondary laser in accordance with the point-to-point architecture depicted in FIG. 10A.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc—read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include computer program storage in memory for execution by personal computers, workstations, clients, and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

As used herein, "modem termination system" (MTS) refers to a termination unit including one or more of an Optical Network Terminal (ONT), an optical line termination (OLT), a network termination unit, a satellite termination unit, a cable modem termination system (CMTS), and/or other termination systems which may be individually or collectively referred to as an MTS.

As used herein, "modem" refers to a modem device, including one or more a cable modem (CM), a satellite modem, an optical network unit (ONU), a DSL unit, etc., which may be individually or collectively referred to as modems.

As described herein, a "PON" generally refers to a passive optical network or system having components labeled according to known naming conventions of similar elements that are used in conventional PON systems. For example, an OLT may be implemented at an aggregation point, such as a headend/hub, and multiple ONUs may be disposed and operable at a plurality of end user, customer premises, or subscriber locations. Accordingly, an "uplink transmission" refers to an upstream transmission from an end user to a headend/hub, and a "downlink transmission" refers to a downstream transmission from a headend/hub to the end user, which may be presumed to be generally broadcasting continuously (unless in a power saving mode, or the like).

As used herein, unless described to the contrary, "digital communication medium" may refer to one or more of a wireless or wired media, including cable, coaxial, and/or fiber optic media. Additionally, "optical transport medium" may refer to one or more of optical fiber and free space optics transmission media.

Figure 1:
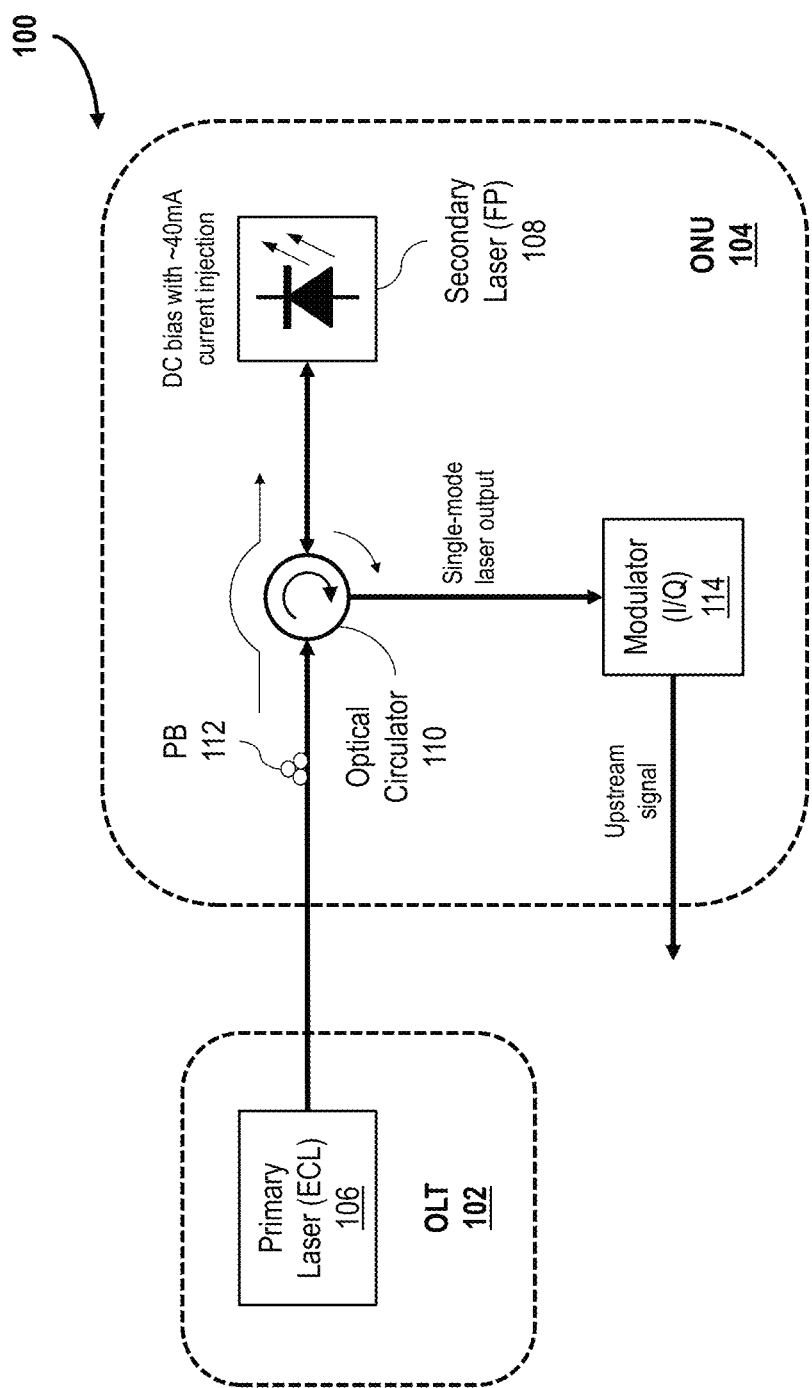
FIG. 1 is a schematic illustration of a conventional COIL architecture.

The present systems and methods provide innovative COIL technology solutions that may be implemented with respect to generic architecture 100, as described above with respect to FIG. 1, and also with respect to emerging and advanced optical network elements and configurations, such as a coherent full-field transmitter and/or a coherent PON. The following embodiments further describe advantageous structural design considerations of a COIL secondary laser, as well as improved techniques for optimizing performance of such secondary lasers implemented in both Point-to-Point (P2P) and Point-to-Multi-Point (P2MP) link application scenarios in a coherent optical access network.

In an exemplary embodiment, the design and implementation of the COIL secondary laser utilizes rate-equation models and calculations to optimize the frequency response and threshold current of the secondary laser. In some embodiments, the secondary laser frequency response and threshold current are optimized with respect to the direct modulation paradigm of COIL systems, described above, which is particularly useful for the emerging 100 G and 200 G coherent optical access networks.

In an embodiment, the present COIL techniques optimize the injection locked secondary laser by determining the detuning frequency range for stable injection-locking. For a stable locking regime, the present techniques simplify the complex field E(t) of the injection-locked laser by modeling a free running laser with the addition of an injection term, which may be mathematically represented according to the rate equation:

$$\frac{dE(t)}{dt} = \frac{1}{2}g\Delta N(1+j\alpha)E(t) + kS_{inj} - j\Delta f E(t), \quad \text{(Eq. 1)}$$

where g is the linear gain coefficient, $\Delta N$ represents the carrier number, $\alpha$ is the linewidth enhancement factor, k is the coupling rate, $S_{inj}$ is the injected photon number, and $\Delta f$ is the detuning frequency of the laser.

The complex field E(t) of the secondary laser may then be split into the following three differential equations to describe the photon number S(t), phase $\emptyset(t)$, and carrier number N(t), respectively, of the laser:

$$\frac{dS(t)}{dt} = \{g[N(t)-N_{tr}] - \gamma_P\}S(t) + 2k\sqrt{S_{inj}S(t)}\cos[\emptyset(t)-\emptyset_{inj}]; \quad \text{(Eq. 2)}$$

$$\frac{d\emptyset(t)}{dt} = \frac{\alpha}{2}\{g[N(t)-N_{tr}] - \gamma_P\} - k\sqrt{\frac{S_{inj}}{S(t)}}\sin[\emptyset(t)-\emptyset_{inj}] - \Delta f; \text{ and} \quad \text{(Eq. 3)}$$

$$\frac{dN(t)}{dt} = J(t) - \gamma_N N(t) - g[N(t)-N_{tr}]S(t), \quad \text{(Eq. 4)}$$

where $N_{tr}$ is the transparency carrier number, $\emptyset_{inj}$ is the injected phase, J is the current, $\gamma_N$ is the carrier recombination rate, and $\gamma_P$ is the photon decay rate.

These photon number, phase, and carrier number equations thus define the temporal response of the secondary laser in the COIL system. Accordingly, when under steady state operation, because there is substantially no time variation in the photon number, phase, and carrier number of the secondary laser, the time derivative portions of the equations described above will equal zero.

Using the equations described above, the steady state COIL system may be further described according to its steady state phase $\emptyset_0$, the steady state carrier number $\Delta N_0$, the steady state photon number $S_0$, and the free-running photon number $S_{fr}$. The steady state phase $\emptyset_0$ may be calculated according to:

$$\emptyset_0 = \sin^{-1}\left\{-\frac{\Delta\omega_{inj}}{k\sqrt{1+\alpha^2}}\sqrt{\frac{S_0}{S_{inj}}}\right\} - \tan^{-1}\alpha \quad \text{(Eq. 5)}$$

The steady state carrier number $\Delta N_0$ may be calculated according to:

$$\Delta N_0 = -\frac{2k}{g}\sqrt{\frac{S_{inj}}{S_0}}\cos\emptyset_0 \quad \text{(Eq. 6)}$$

The steady state photon number $S_0$ may be calculated according to:

$$S_0 = \frac{S_{fr} - (\gamma_N/\gamma_P)\Delta N_0}{1 + (g\Delta N_0/\gamma_P)} \quad \text{(Eq. 7)}$$

The free-running photon number $S_{fr}$ may be calculated according to:

$$S_{fr} = \frac{J - \gamma_N N_{th}}{\gamma_P} \quad \text{(Eq. 8)}$$

Under steady state, the phase value $Ø_0$ is expected to fall within a locking range between $$-\frac{\pi}{2}$$

and $\cot^{-1}\alpha$ (described further below with respect to FIG. 2). Thus, by selecting a value for $Ø_0$ within the locking range, the detuning frequency $\Delta f$ may be determined from Eq. 5 as follows:

$$\Delta f = \Delta\omega_{inj}/2\pi = (\omega_{ML} - \omega_{fr})/2\pi, \quad (Eq.\ 9)$$

which proportionally represents the frequency difference between the primary frequency $\omega_{ML}$ of the upstream primary laser and the free-running frequency $\omega_{fr}$ of the downstream secondary laser.

In an exemplary embodiment, several physical design parameters of the secondary laser may be determined by calculating the maximum injection ratio $\eta_0$ according to:

$$\eta_0 = \frac{c}{2n_g L} \frac{(1-R)}{\sqrt{R}} \sqrt{\frac{\eta_c P_{primary}}{P_{secondary}}} \quad (Eq.\ 10)$$

where $n_g$ is the group index (e.g., 3.5 in this example), L is laser cavity length, R is reflectivity at the cleaved facet (e.g., 32% in this example), $\eta_c$ is the coupling efficiency of the laser (e.g., 0.6 in this example), and $$\frac{P_{primary}}{P_{secondary}}$$

is the external power injection ratio (e.g., 1.5 in this example). Each of these parameters may then directly relate to optimizing the physical design of the COIL secondary laser.

Additionally, the coupling rate parameter k may be proportional to the injection ratio according to:

$$k\sqrt{\frac{S_{inj}}{S_0}} = \frac{\eta_0}{R_{FE}}, \quad (Eq.\ 11)$$

where $S_0$ is again the steady state photon number, $S_{inj}$ is again the injected photon number, and $R_{FE}$ represents the field enhancement factor, $$R_{FE} = \frac{A_0}{A_{fr}},$$

as the ratio between the steady-state field magnitude $A_0$ and free-running field magnitude $A_{fr}$.

Using these calculations, the detuning frequency $\Delta f$ of the COIL secondary laser may thus be determined according to:

$$\Delta f = -\frac{k\sqrt{1+\alpha^2}}{2\pi}\sqrt{\frac{S_{inj}}{S_0}}\sin(Ø_0 + \tan^{-1}\alpha) = \quad (Eq.\ 12)$$

$$-\frac{\eta_0}{2\pi R_{FE}}\sqrt{1+\alpha^2}\sin(Ø_0 + \tan^{-1}\alpha)$$

From this equation, the detuning frequency range for stable injection-locking of the secondary laser may be plotted, as described below with respect to FIG. 2.

Figure 2:
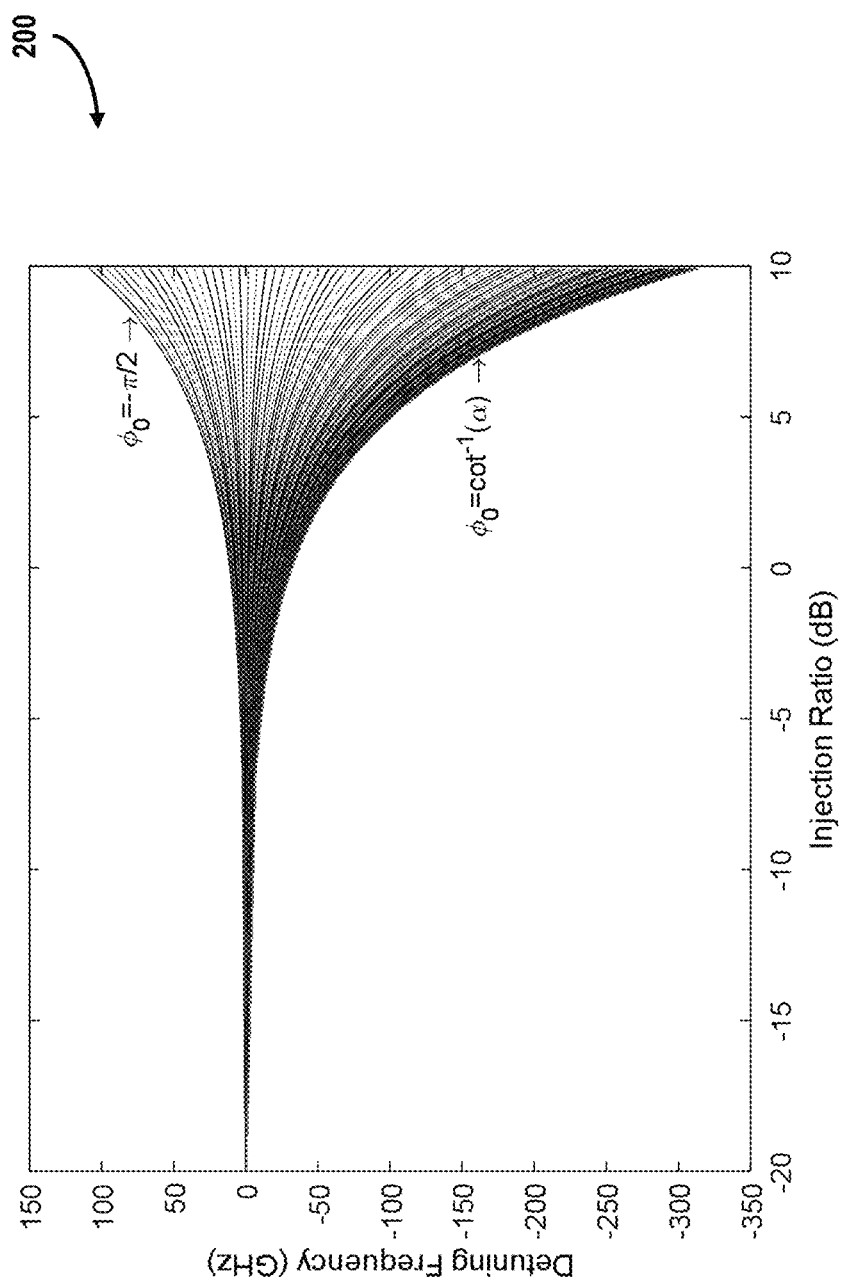
FIG. 2 is a graphical illustration depicting a plot of COIL detuning frequency against injection ratio and phase, in accordance with an embodiment.

FIG. 2 is a graphical illustration depicting a plot 200 of COIL detuning frequency against injection ratio and phase. For the exemplary embodiment depicted in FIG. 2, it was assumed that is a constant value at $R_{FE}=1$, and that the linewidth enhancement factor is a constant value at $\alpha=2.7$. Plot 200 thus represents the detuning frequency range for stable injection-locking of the secondary laser calculated according to Eq. 12, above, over a range of values for the external injection ratio $$\frac{P_{primary}}{P_{secondary}}$$

from $-20$ dB to $+10$ dB, and range of values for the steady state phase $Ø_0$ from $$-\frac{\pi}{2}$$

to $\cot^{-1}\alpha$.

In real-world implementations though, neither of the values for $R_{FE}$ and $\alpha$ are expected to be constant across the detuning range depicted in FIG. 2. Accordingly, in an exemplary embodiment, a more accurate model of the detuning range is obtained by adopting experimentally extracted data parameters for an injection-locked quantum-dash FP laser, as shown below in Table 1.

TABLE 1

| $\eta_0$ (GHz) | $\alpha$ | $Ø_0$ (rad) | $R_{FE}$ |
|---|---|---|---|
| 99 | 2.8 | −1.57 | 1 |
| 99 | 2.0 | −1.45 | 1.08 |
| 99 | 2.1 | −1.39 | 1.12 |
| 99 | 2.1 | −1.31 | 1.19 |
| 94 | 2.15 | −1.26 | 1.30 |
| 94 | 2.9 | −1.03 | 1.35 |
| 99 | 2.9 | −0.841 | 1.42 |
| 99 | 1.9 | +0.1 | 1.45 |

The testing data illustrated above in Table 1 demonstrates that the field enhancement factor $R_{FE}$ does equal 1 at the positive frequency detuning edge, but is greater than 1 when the detuning frequency is decreased from the positive edge. Using this experimental data from Table 1 with the detuning calculation shown in Eq. 12 thus enables a significantly more accurate frequency detuning range model, as described below with respect to FIG. 3.

Figure 3:
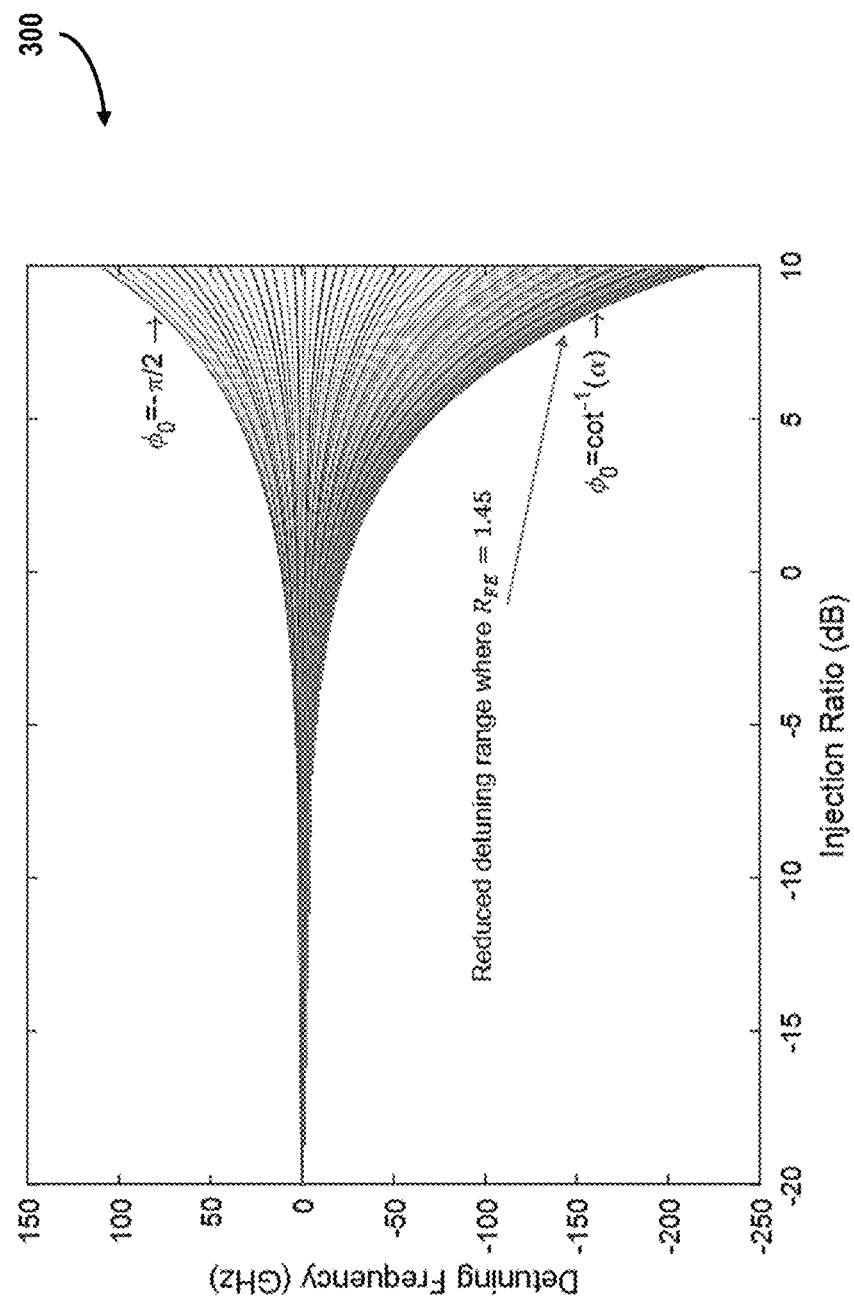
FIG. 3 is a graphical illustration depicting an optimized COIL detuning frequency plot using experimentally extracted data, in accordance with an embodiment.

FIG. 3 is a graphical illustration depicting an optimized COIL detuning frequency plot 300 using the experimentally extracted data from Table 1. Plot 300 is thus similar to plot 200, FIG. 2, except that in plot 300, it may be seen that, at the negative frequency detuning edge, a reduced detuning range is shown where $R_{FE}=1.45$.

In an exemplary embodiment, a linearization of the above differential equations may be placed in matrix form to obtain the small-signal solution of the rate equation. Accordingly, the absolute modulation frequency response function $|H_R|$ of the COIL secondary laser may be expressed according to:

$$|H_R|^2 = \frac{\left(\frac{C}{Z}\right)^2(\omega^2+Z^2)}{(C-A\omega^2)^2+(B\omega-\omega^3)^2\left(1+\left(\frac{\omega}{\gamma_C}\right)^2\right)}, \quad \text{(Eq. 13)}$$

where:

$$A = (\gamma_{fr} - \gamma_N)R_{FE}^2 + \gamma_N + \gamma_{th}; \quad \text{(Eq. 14)}$$

$$B = \omega_r^2 + \gamma_N\gamma_{th} + \frac{\eta_0^2}{R_{FE}^2} + \gamma_{th}[(\gamma_{fr}-\gamma_N)R_{FE}^2+\gamma_N]; \quad \text{(Eq. 15)}$$

$$C = \frac{\eta_0^2}{R_{FE}^2}[\gamma_N + (\gamma_{fr}-\gamma_N)R_{FE}^2] - (\omega_r^2 + \gamma_N\gamma_{th})Z; \text{ and} \quad \text{(Eq. 16)}$$

$$Z = (\eta_0/R_{FE})(\alpha\sin\phi_0 - \cos\phi_0), \quad \text{(Eq. 17)}$$

where $\omega_r$ is the free-running relaxation frequency, $\gamma_{fr}$ is the free-running damping rate, $\gamma_C$ is the inverse parasitic carrier transport time, and $\gamma_{th}$ is the threshold gain shift. Therefore, through further utilization of the extracted experimental data results from Table 1, the small-signal frequency response of the function $|H_R|^2$, as described in Eq. 13, may be plotted under various frequency detuning values, as described below with respect to FIG. 4.

Figure 4:
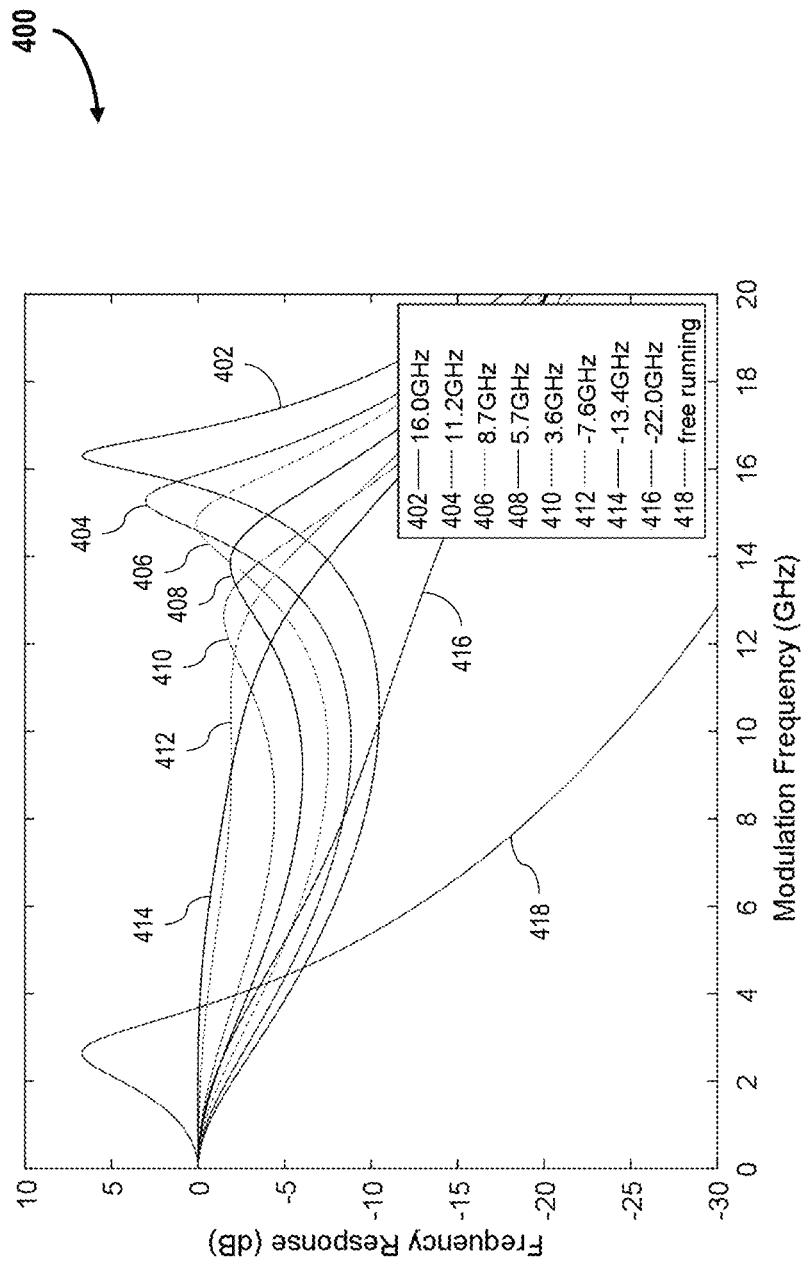
FIG. 4 is a graphical illustration depicting a comparative plot of small-signal detuning frequency responses of a COIL secondary laser, in accordance with an embodiment.

FIG. 4 is a graphical illustration depicting a comparative plot 400 of small-signal detuning frequency responses 402-418 of a COIL secondary laser. In the embodiment depicted in FIG. 4, comparative plot 400 superimposes the small-signal frequency response 418 of the COIL secondary laser in the free-running state, with the small-signal frequency responses 402-416 of the laser at different frequency detuning values. More particularly, and in accordance with the data values shown in Table 1, for comparative plot 400, the detuning frequency was set to a range between −22 GHz (i.e., small-signal detuning frequency response 416) and +16 GHz (i.e., small-signal detuning frequency response 402). As illustrated in FIG. 4, when the steady state phase $\phi_0$ is $$-\frac{\pi}{2},$$

the positive frequency detuning demonstrates an improved frequency response. Based on this result from comparative plot 400, positive frequency detuning is utilized for the additional laser design and optimization embodiments described further below.

In contrast, when the COIL secondary laser is uncoupled and running freely, the frequency response of the laser may be extracted according to the conventional model modulation frequency response function:

$$|H_R|^2 = \frac{\omega_r^4}{(\omega_r^2-\omega^2)^2+\gamma_{fr}^2\omega^2} \cdot \frac{1}{1+\left(\frac{\omega}{\gamma_C}\right)^2} \quad \text{(Eq. 18)}$$

Accordingly, because the free-running oscillation frequency $\omega_r$, damping rate $\gamma_{fr}$, and the parasitic roll-off introduced by $\gamma_C$ are intrinsic parameters of the secondary laser, and because these parameters are expected to remain unchanged when the secondary laser is injection-locked, the free-running frequency response may be utilized to extract these three free-running parameters. Small-signal frequency response 418 therefore represents simulated results of a free-running FP laser using experimentally extracted values for $\omega_r$ (i.e., 2π·2.8 rad/s), $\gamma_{fr}$ (i.e., 8.1 GHz), and $\gamma_C$ (i.e., 67 GHz).

It may be further noted from comparative plot 400 how significantly the modulation bandwidth of the COIL secondary laser may be enhanced using the injection locking techniques described herein. For example, in a COIL system according to the embodiments described herein, the resonance frequency enhancement $\Delta\omega_R$ of an injection-locked secondary laser may be expressed, with respect to the free-running state of the secondary laser, as:

$$\Delta\omega_R = -\frac{V_g}{2L}\sqrt{\frac{(1-R)^2}{R}R_{ext}}\sin(\phi_0) \quad \text{(Eq. 19)}$$

From Eq. 19, it may be seen that the resonance frequency enhancement is maximized when $$\phi_0 = -\frac{\pi}{2},$$

which occurs at the positive frequency detuning edge depicted in FIG. 3, described above.

Figure 5:
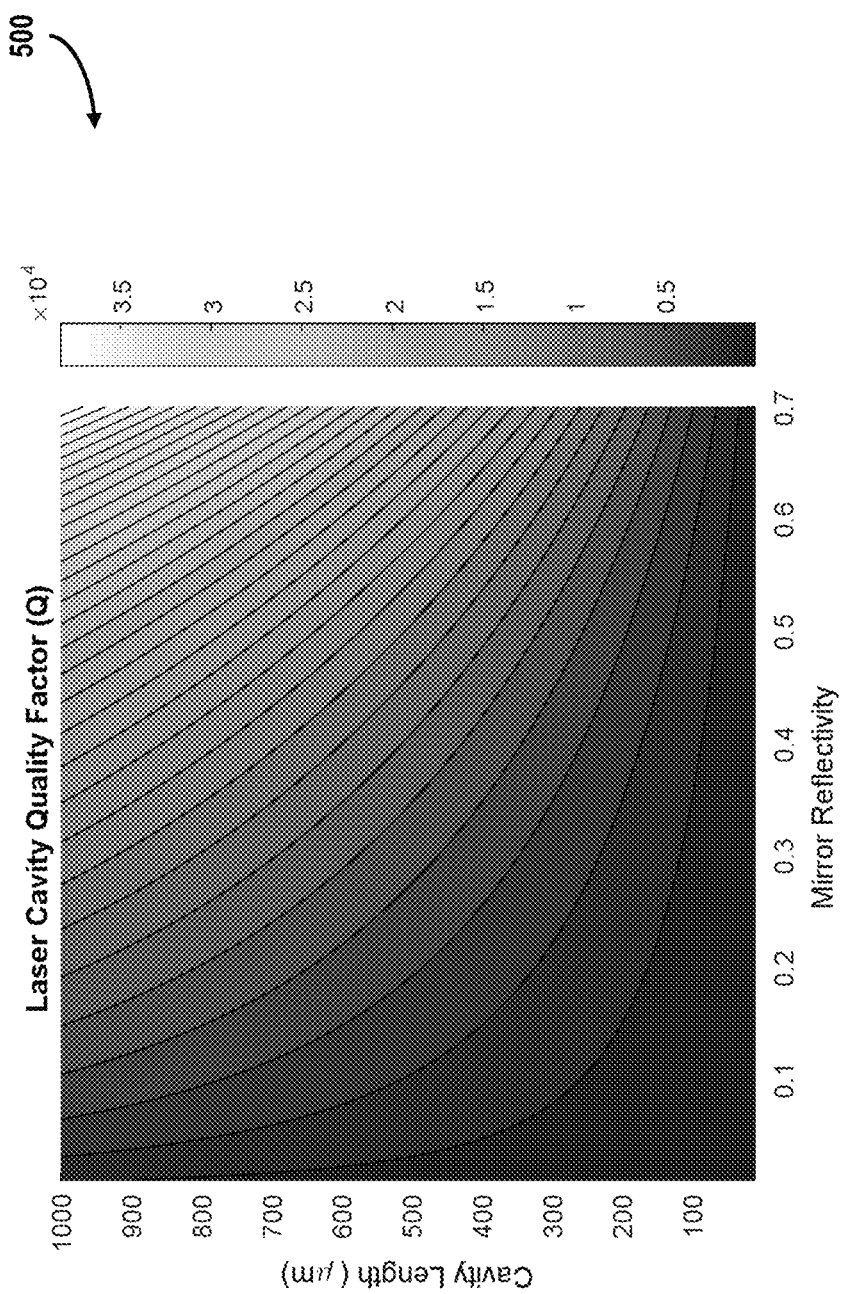
FIG. 5 is a graphical illustration depicting a plot of a COIL secondary laser cavity quality factor as a function of cavity length and facet reflectivity, in accordance with an embodiment.

FIG. 5 is a graphical illustration depicting a plot 500 of a COIL secondary laser cavity quality factor as a function of cavity length and facet reflectivity. More particularly, plot 500 illustrates the cavity quality factor Q as a function of both the cavity length L and the cavity facet reflectivity R. In general terms, a shorter cavity with a lower mirror reflectivity will be expected to typically exhibit a lower Q value, and thus a higher resonance frequency.

Accordingly, the maximum resonance frequency response may be expressed according to:

$$\Delta\omega_{Rmax} = \frac{V_g}{2L}\sqrt{\frac{(1-R)^2}{R}R_{ext}} = \frac{\omega_0}{2Q}\sqrt{R_{ext}} \quad \text{(Eq. 20)}$$

The quality factor Q of the secondary laser cavity may therefore be expressed as:

$$Q = \frac{\omega_0 L}{V_g}\frac{\sqrt{R}}{1-R}, \quad \text{(Eq. 21)}$$

where $\omega_0$ represents the angular frequency of the laser. Eq. 21 demonstrates the direct relationship of the quality factor Q to the physical structural design of the laser cavity. Accordingly, a laser cavity having a lower Q value is indicative of a higher resonance frequency enhancement, as well as a higher modulation bandwidth.

FIGS. 6A-C are graphical illustrations depicting comparative frequency response plots 600, 602, 604 under different respective cavity quality factors at the positive frequency detuning edge. More particularly, as depicted in FIG. 6A, comparative frequency response plot 600 superimposes, for a Q value of 13301, an L value of 1000 μm, and an R value of 0.36, the free running frequency response 606 against the frequency responses 608-616 for injection power ranging from −10 dB (i.e., frequency response 608) to +10 dB (i.e., frequency response 616). Similarly, comparative frequency response plot 602, FIG. 6B, superimposes frequency responses 606'-616' for a Q value of 5901.4, whereas comparative frequency response plot 604, FIG. 6C, superimposes frequency responses 606"-616" for a Q value of 3330 (L=300 µm, R=0.30).

As illustrated from comparative frequency response plots 600-604, at the lower Q value of 3330 (i.e., plot 604, FIG. 6C), the frequency response rise to 70 GHz, or higher, under strong optical injection power. In contrast, at high Q values (i.e., plot 600, FIG. 6A), the frequency response remains under 20 GHz at the same injection power level(s).

FIG. 7 is a graphical illustration depicting a plot 700 of a COIL secondary laser threshold current as a function of mirror reflectivity and cavity length. More particularly, in the exemplary embodiment depicted in FIG. 7, plot 700 represents the calculated secondary laser threshold current is plotted in relation to the mirror reflectivity R and the cavity length L. As demonstrated by plot 700, although maintaining relatively lower values for R and L may result in improved modulation bandwidth, optimization of these parameters alone will not automatically result in lower power consumption for the secondary laser. Depending on the particular application of the COIL system, a trade-off between the calculations represented by plot 500, FIG. 5, and plot 700, FIG. 7, may be desirable to optimize the COIL secondary laser to the particular applications.

For example, although a low Q laser design may be generally considered optimum for achieving a high modulation bandwidth, the trade-off between high resonance frequency and low threshold current $I_{th}$, (i.e., through the photon lifetime $\tau_c$) may be expressed by:

$$\tau_c \cdot \Delta\omega_{Rmax} = \frac{1}{2}\sqrt{R_{ext}} \qquad \text{(Eq. 22)}$$

Accordingly, under some injection ratios, higher modulation bandwidths may give rise to shorter relative photon lifetimes, which in turn may result in a higher laser threshold current, and thus a greater power consumption.

Similar to the cavity quality factor Q, the photon lifetime $\tau_c$ may also be determined using the cavity length L and the mirror reflectivity R, but according to:

$$\frac{1}{\tau_c} = \frac{V_g}{L}\log\left(\frac{1}{\sqrt{R}}\right) + V_g\breve{\alpha}, \qquad \text{(Eq. 23)}$$

where $\breve{\alpha}$ is waveguide modal loss (using a value of $\breve{\alpha}=15$ 1/cm, in this example).

Once the value for the photon lifetime $\tau_c$ is obtained, the laser threshold gain $g_{th}$ may be calculated according to:

$$g_{th} = \frac{1}{\Gamma_a V_g \tau_c} \qquad \text{(Eq. 24)}$$

The threshold carrier density $n_{th}$ may also be calculated according to:

$$n_{th} = n_{tr} e^{g_{th}/g_0}, \qquad \text{(Eq. 25)}$$

where $n_{tr}$ is the transparency carrier density ($n_{tr}=1.75 \times 10^{18}$ 1/cm³, in this example), and $g_0$ is the cavity gain (1500 1/cm, in this example). In an exemplary scenario of an FPLD as the secondary laser, an active region width W=1.5 µm, and a height H=35 nm was selected for the following calculations. The person of ordinary skill in the art will understand that these particular values are selected by way of example and are not intended to be limiting.

From the calculations and selected parameters described above, the laser threshold current $I_{th}$ may be determined according to:

$$\frac{\eta_i I_{th}}{qV_a} \approx An_{th} + Bn_{th}^2 + Cn_{th}^3, \qquad \text{(Eq. 26)}$$

where, in this example, A=0, B=$10^{-9}$ cm³/s, and C=$5 \times 10^{-29}$ cm⁶/s.

From the calculations described above a time-bandwidth product may be obtained to define the application-based laser design trade-off. This product may thus be advantageously utilized to optimize the COIL secondary laser structural design for P2P and P2MP coherent access networks, and also for injection-locking based optical full-field transmitters, described further below with respect to FIGS. 8A-11.

FIG. 8A is a schematic illustration of a single laser source P2MP architecture 800. FIG. 8B is a schematic illustration of a comb source P2MP architecture 802. Architectures 802, 804 are depicted, for ease of explanation, to include sufficient elements to describe the respective COIL operations thereof, and are not intended to represent all of the hardware and functionality that may be further included in a P2MP system.

In the exemplary embodiment depicted in FIG. 8A, architecture 800 includes an aggregation hub 804 having a primary laser source 806 (which may be a single-wavelength parent seed source or high-quality ECL, for example) that is distributed to a plurality (i.e., 1–N) of coherent full-field or COIL transmitters 808, e.g., through a power splitter 810 configured to split the high-quality signal from primary laser source 806 for injection into the respective secondary lasers (not shown in FIG. 8A) of transmitters 808. Aggregation hub 804 may, for example, represent a headend, hub, data center, or central office in an optical network. According to this exemplary configuration, primary laser source 806 is shared by, and enables injection-locking to, multiple transmitters 808 to significantly reduce the overall system cost of P2MP architecture 800. It may be noted that the "single laser source" description of architecture 800 is intended to describe the relationship of primary laser source 806 to the plurality of transmitters 808, and does not limit a particular aggregation hub to only one primary laser source.

In the exemplary embodiment depicted in FIG. 8B, architecture 802 is similar to architecture 800, FIG. 8A, and includes an aggregation transmitter 812, which may also, for example, represent a headend, hub, data center, or central office in an optical network. Architecture 802 differs from architecture 800 though, in that aggregation transmitter 812 includes a primary optical frequency comb source 814 (e.g., a multi-wavelength seed laser source) distributed to 1–N coherent full-field or COIL transmitters 816, e.g., through a WDM demultiplexer 818 to separates the different wavelengths of primary comb source 814 for injection into the respective secondary lasers (not shown in FIG. 8B) of transmitters 816. Architecture 802 may therefore be particularly useful for P2P single-fiber WDM network configurations, as described further below with respect to FIGS. 10A-B.

FIG. 9 is a graphical illustration depicting a comparative frequency response plot 900 of a short-cavity secondary laser in accordance with P2MP architecture 800, FIG. 8A. In the experimental embodiment depicted in FIG. 9, comparative frequency response plot 900 was generated for P2MP architecture 800 utilizing an ECL for primary laser source 806 having an output power up to +15 dBm, and an FPLD for the secondary laser of transmitter 808 having an output power of approximately +10 dBm. More particularly, comparative frequency response plot 900 superimposes, for a Q value of 670.2, the free running frequency response 902 against the frequency response 904 at −20 dB, the frequency response 906 at −13 dB, and the frequency response 908 at −10 dB.

In the exemplary embodiment depicted in FIG. 9, a low external injection ratio design was emphasized to achieve a high splitting ratio. Additionally, for the FPLD design of plot 900, a relatively short cavity length (i.e., L=120 μm), and a relatively low mirror reflectivity (i.e., R=0.12) at the output facet, were selected to balance the trade-off between power consumption and modulation bandwidth. Using the calculations described above with respect to FIG. 7, this short cavity design would expect to require an approximately 32 mA laser threshold current $I_{th}$. However, as may be seen from comparative frequency response plot 900, even this short cavity design is sufficient to support a sufficient modulation bandwidth under a high power splitting ratio.

Alternatively, when the external injection ratio is −20 dB, the laser modulation bandwidth of the FPLD may be extended to greater than 10 GHz, and the power splitting ratio may be as high as 316. Furthermore, in the case where the injection ratio is increased to −13 dB, even though the splitting ratio is reduced to 63, the modulation bandwidth may be improved to be greater than 25 GHz. Accordingly, to achieve an even higher modulation rate, the external injection ratio may be still further increased to −10 dB, and with a reduced splitting ratio of 31, the bandwidth of a particular transmitter 808 may be increased to as much as 35 GHz, and beyond. Application of the principles of FIG. 9 though, are fully suitable to the multi-source comb laser 814 and injection-locked secondary lasers (in transmitters 816) of architecture 802, FIG. 8B, without departing from the scope herein. Secondary laser design considerations, which may be more particular to P2P links, are described further below with respect to FIGS. 10A-11.

FIG. 10A is a schematic illustration of a single-source P2P architecture 1000. FIG. 10B is a schematic illustration of a single-source cascaded P2P architecture 1002. Architectures 1002, 1004 are depicted, for ease of explanation, to include sufficient elements to describe the respective COIL operations thereof, and are not intended to represent all of the hardware and functionality that may be further included in a P2P system.

In the exemplary embodiment depicted in FIG. 10A, architecture 1000 includes a P2P aggregation hub 1004 having a primary laser source 1006 (which may be a single-wavelength parent seed source or high-quality ECL, for example) that with an individual coherent full-field or COIL transmitter 1008. P2P aggregation hub 1004 may also, for example, represent one or more of a headend, hub, data center, or central office in an optical network. According to this exemplary configuration, primary laser source 1006 communicates with, and enables injection-locking to, a particular transmitter 1008 to reduce the cost of P2P transmitter 1008 of architecture 1000. It may be noted that the "single-source" description of architecture 1000 is again intended to describe the interrelationship of primary laser source 1006 and transmitter 1008, and does not limit a particular P2P aggregation hub 1004 to only one primary laser source 1006.

In the exemplary embodiment depicted in FIG. 10B, architecture 1002 is similar to architecture 1000, FIG. 10A, and includes a cascaded aggregation hub transmitter 1010, which may also, for example, represent a headend, hub, data center, or central office in an optical network. Architecture 1002 differs from architecture 1000 though, in that cascaded aggregation hub transmitter 1010 includes a plurality of coherent full-field or COIL transmitters 1014 having respective secondary lasers (not shown in FIG. 10B) therein for injection locking to primary laser source 1012. However, in this P2P system design configuration, only a first transmitter 1014 (i.e., Transmitter-1, element 1014(1)) is illustrated to directly communicate with primary laser 1012, whereas transmitters 1014(2)-1014(N) must obtain the seed signal from a communication from a preceding transmitter secondary laser source in a cascaded design.

Accordingly, in this alternative application scenario, i.e., a direct P2P or a cascaded link from one secondary to another in a chain, the secondary FP laser design may focus on low power consumption and high modulation bandwidth, without having to give serious attention to the power splitting ratio. By balancing threshold current and the modulation rate, parameter values were selected for L=200 μm and R=0.4 in the example depicted in FIG. 11. Referring back to the calculation results obtained with respect to FIG. 7 a threshold current values as low as 14 mA may be expected for this design.

FIG. 11 is a graphical illustration depicting a comparative frequency response plot 1100 of a low-threshold secondary laser in accordance with P2P architecture 1000, FIG. 10A. In the experimental embodiment depicted in FIG. 11, comparative frequency response plot 1100 was generated for P2P architecture 1000 utilizing an ECL for primary laser source 1006 and an FPLD for the secondary laser of transmitter 1008. More particularly, comparative frequency response plot 1100 superimposes, for a Q value of 2991, the free running frequency response 1102 against the frequency response 1104 at −5 dB, the frequency response 1106 at 0 dB, and the frequency response 1108 at −5 dB. Given these parameters, a cavity length L=200 μm, a mirror reflectivity r=0.4, and a laser threshold current $I_{th}$=14 mA. were selected for the calculations underlying the experimental results of comparative frequency response plot 1100, FIG. 11.

From the experimental results depiced in FIG. 11, it may be seen that the modulation bandwidth is also significantly improved under stronger optical injection (i.e., values of −5 dB, 0 dB, and +5 dB used in this example, respectively), and with resulting peak frequency reponse values ranging from approximately 15 GHz (i.e., at −5 dB) up to 46 GHz (i.e., at +5 dB). Application of the principles of FIG. 11 though, are fully suitable for implementation within the paradigm of cascaded injection-locked transmitters and secondary lasers (in transmitters 1014) of architecture 1002, FIG. 10B, without departing from the scope herein.

In the exemplary embodiment depicted in FIG. 9, a low external injection ratio design was emphasized to achieve a high splitting ratio. Additionally, for the FPLD design of plot 900, a relatively short cavity length (i.e., L=120 μm), and a relatively low mirror reflectivity (i.e., R=0.12) at the output facet, were selected to balance the trade-off between power consumption and modulation bandwidth. Using the calculations described above with respect to FIG. 7, this short cavity design would expect to require an approximately 32 mA laser threshold current $I_{th}$. However, as may be seen from comparative frequency response plot 900, even this short cavity design is sufficient to support a sufficient modulation bandwidth under a high power splitting ratio.

Alternatively, when the external injection ratio is −20 dB, the laser modulation bandwidth of the FPLD may be extended to greater than 10 GHz, and the power splitting ratio may be as high as 316. Furthermore, in the case where the injection ratio is increased to −13 dB, even though the splitting ratio is reduced to 63, the modulation bandwidth may be improved to be greater than 25 GHz. Accordingly, to achieve an even higher modulation rate, the external injection ratio may be still further increased to −10 dB, and with a reduced splitting ratio of 31, the bandwidth of a particular transmitter 808 may be increased to as much as 35 GHz, and beyond. Secondary laser design considerations, which may be more particular to P2P links, are described further below with respect to FIGS. 10A-11.

The embodiments described above therefore significantly resolve the cost and complexity challenges of presented by implementation of the laser source for coherent downstream users in both the P2P and the P2MP access network. Whereas high-quality laser sources are known, such lasers are considered too expensive for practical implementation at the end user location in a coherent network. This cost prohibition is significant for a single end user in a P2P access network, and orders of magnitude greater for the P2MP access network, which may include hundreds of end users for each primary laser transmitter at an aggregation hub.

The innovative systems and methods herein thus demonstrate significant solutions to not only inexpensively provide a high-quality and less expensive laser source at each downstream end user (e.g., an ONU), but also advantageous techniques for optimizing both the physical design and the power consumption for this downstream laser source according to the particular application in which the secondary laser is deployed.

Exemplary embodiments of optical communication systems and methods utilizing COIL are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments can be implemented and utilized in connection with other access networks utilizing fiber and coaxial transmission at the end user stage.

The embodiments herein are therefore particularly useful in coherent PONs or communication systems utilizing a DOCSIS protocol; however, the present embodiments are also of significant value for optical networks including protocols such as EPON, RFoG, GPON, and/or Satellite Internet Protocol, without departing from the scope herein. The present systems and methods may further be advantageously configured for use in existing 4G and 5G networks, and also for new radio and future generation 5G and 6G network implementations, including wired optical media and/or free space optics systems.

Although specific features of various embodiments of the disclosure may be shown in some drawings and not in others, such illustrative techniques are for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also enables a person skilled in the art to practice the embodiments, including the make and use of any devices or systems and the performance of any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An injection locking laser source for an optical communications system, the injection locking laser source comprising:
   a laser cavity configured to receive, from a remote primary laser source, an externally injected low linewidth primary light signal, wherein the laser cavity includes a cavity length, a cavity facet reflectivity, and a cavity quality factor; and
   an emitting region configured to output a secondary light source injection locked to the externally injected low linewidth primary light signal at a stable detuning frequency based on a steady-state photon number, a steady-state phase, and a steady-state carrier number of the injection locking laser source,
   wherein the steady-state photon number, the steady-state phase, and the steady-state carrier number represent substantially no time variation in a photon number, a phase, and a carrier number of the injection locking laser source, respectively.

2. The injection locking laser source of claim 1, comprising a semiconductor laser.

3. The injection locking laser source of claim 1, wherein the semiconductor laser comprises a Fabry-Perot laser diode (FPLD).

4. The injection locking laser source of claim 1, wherein the steady-state phase is within a locking range between $-\pi/2$ and $\cot^{-1}\alpha$ where $\alpha$ is a linewidth enhancement factor.

5. The injection locking laser source of claim 1, wherein the stable detuning frequency comprises a positive frequency detuning value.

6. The injection locking laser source of claim 5, wherein the positive frequency detuning value is obtained according to an absolute frequency response function of the injection locking laser source.

7. The injection locking laser source of claim 5, wherein the laser cavity comprises a resonance frequency based on the cavity length, the cavity facet reflectivity, and the cavity quality factor.

8. The injection locking laser source of claim 7, wherein the laser cavity includes a modulation bandwidth characteristic based on the resonance frequency.

9. The injection locking laser source of claim 5, wherein the cavity quality factor is function of the cavity length and the cavity facet reflectivity.

10. The injection locking laser source of claim 9, wherein the cavity quality factor is further proportional to an angular frequency of the injection locking laser source.

11. The injection locking laser source of claim 10, wherein the emitting region is configured to exhibit a lower frequency response in relation to a higher value for the cavity quality factor.

12. The injection locking laser source of claim 5, further comprising an operational threshold current value.

13. The injection locking laser source of claim 12, wherein the threshold current value is a function of the cavity length and the cavity facet reflectivity.

14. The injection locking laser source of claim 13, wherein the threshold current value is based on a photon lifetime value.

15. The injection locking laser source of claim 14, wherein the photon lifetime value decreases with an increase in a modulation bandwidth characteristic of the laser cavity.

16. An aggregation transmitter, comprising:
a primary laser source outputting at least one narrow linewidth light signal;
an external secondary laser source including (i) a secondary laser cavity configured to receive the at least one narrow linewidth signal injected therein from the primary laser source, and (ii) an emitting region configured to output a secondary light signal injection locked to the injected narrow linewidth light signal from the primary laser source at a stable detuning frequency based on a steady-state photon number, a steady-state phase, and a steady-state carrier number of the external secondary laser source; and
a splitter separating the primary laser source from the external secondary laser source,
wherein the steady-state photon number, the steady-state phase, and the steady-state carrier number represent substantially no time variation in a photon number, a phase, and a carrier number of the external secondary laser source, respectively.

17. The aggregation transmitter of claim 16, wherein the primary laser source laser source comprises an external cavity laser (ECL), and wherein the external secondary laser source comprises a Fabry-Perot laser diode (FPLD).

18. The aggregation transmitter of claim 16, wherein the external secondary laser source is disposed within at least one of a coherent full-field transmitter and a coherent optics injection locking (COIL) transmitter.

19. The aggregation transmitter of claim 18, comprising a point-to-point (P2P) communication network, and wherein the at least one of the coherent full-field transmitter and the COIL transmitter comprises a plurality of cascaded transmitters having a first a cascaded transmitter in substantially direct communication with the at least one narrow linewidth light signal from the primary laser source.

20. The aggregation transmitter of claim 18, comprising a point-to-multipoint (P2MP) communication network, and wherein the at least one of the coherent full-field transmitter and the COIL transmitter comprises a plurality of distributed transmitters, wherein each distributed transmitter of the plurality of distributed transmitters is in substantially direct communication with the at least one narrow linewidth light signal from the primary laser source.

* * * * *